(12) United States Patent
Binder et al.

(10) Patent No.: US 10,843,248 B2
(45) Date of Patent: Nov. 24, 2020

(54) BENDING TOOL, IN PARTICULAR AN UPPER TOOL OR A BENDING PUNCH, AND A METHOD FOR CHANGING THE OPERATING MODE

(71) Applicant: TRUMPF Maschinen Austria GmbH & Co. KG., Pasching (AT)

(72) Inventors: Thomas Binder, Linz (AT); Philipp Caha, Vienna (AT); Markus Pittrich, Alkoven (AT)

(73) Assignee: TRUMPF Maschinen Austria GmbH & Co. KG., Pasching (AT)

( * ) Notice: Subject to any disclaimer, the term of this patent is extended or adjusted under 35 U.S.C. 154(b) by 51 days.

(21) Appl. No.: 16/330,198

(22) PCT Filed: Sep. 12, 2017

(86) PCT No.: PCT/AT2017/060226
§ 371 (c)(1),
(2) Date: Mar. 4, 2019

(87) PCT Pub. No.: WO2018/049451
PCT Pub. Date: Mar. 22, 2018

(65) Prior Publication Data
US 2019/0201958 A1    Jul. 4, 2019

(30) Foreign Application Priority Data

Sep. 16, 2016    (AT) .................................. 50832/2016

(51) Int. Cl.
*B21D 5/00*    (2006.01)
*B21D 5/02*    (2006.01)
*H03K 17/687*    (2006.01)

(52) U.S. Cl.
CPC ............ *B21D 5/004* (2013.01); *B21D 5/0209* (2013.01); *B21D 5/0254* (2013.01); *G05B 2219/49304* (2013.01); *H03K 17/687* (2013.01)

(58) Field of Classification Search
CPC .... B21D 5/004; B21D 5/0209; B21D 5/0254; G05B 2219/45237; G05B 2219/45143; G05B 2219/49304; G05B 2219/49305
See application file for complete search history.

(56) References Cited

U.S. PATENT DOCUMENTS 4,283,929 A  *  8/1981   Heiberger ........... B30B 15/0064
                                                    100/259
6,163,734 A     12/2000  Shigefuji et al.
(Continued)

FOREIGN PATENT DOCUMENTS

AT         506 604 B1      10/2009
AT         507 346 A1       4/2010
(Continued)

OTHER PUBLICATIONS

International Search Report in PCT/AT2017/060226, dated Feb. 2, 2018.

*Primary Examiner* — Edward T Tolan
(74) *Attorney, Agent, or Firm* — Collard & Roe, P.C.

(57) ABSTRACT

The invention relates to a bending tool (1) comprising a tool body (2) having an upper (3) and an opposite lower end region (4), wherein an attachment extension (5) is configured in the upper end region (3), and a working tip (6) is configured in the lower end region (4). A tool identification marker (11) is disposed in the tool body (2), and a communication interface (9) is disposed in the attachment extension (5) on at least one side surface (8) and not projecting beyond it, which interface is connected with the tool identification marker (11) by way of a connection line (10). An electronics (Continued)

Figure 1:
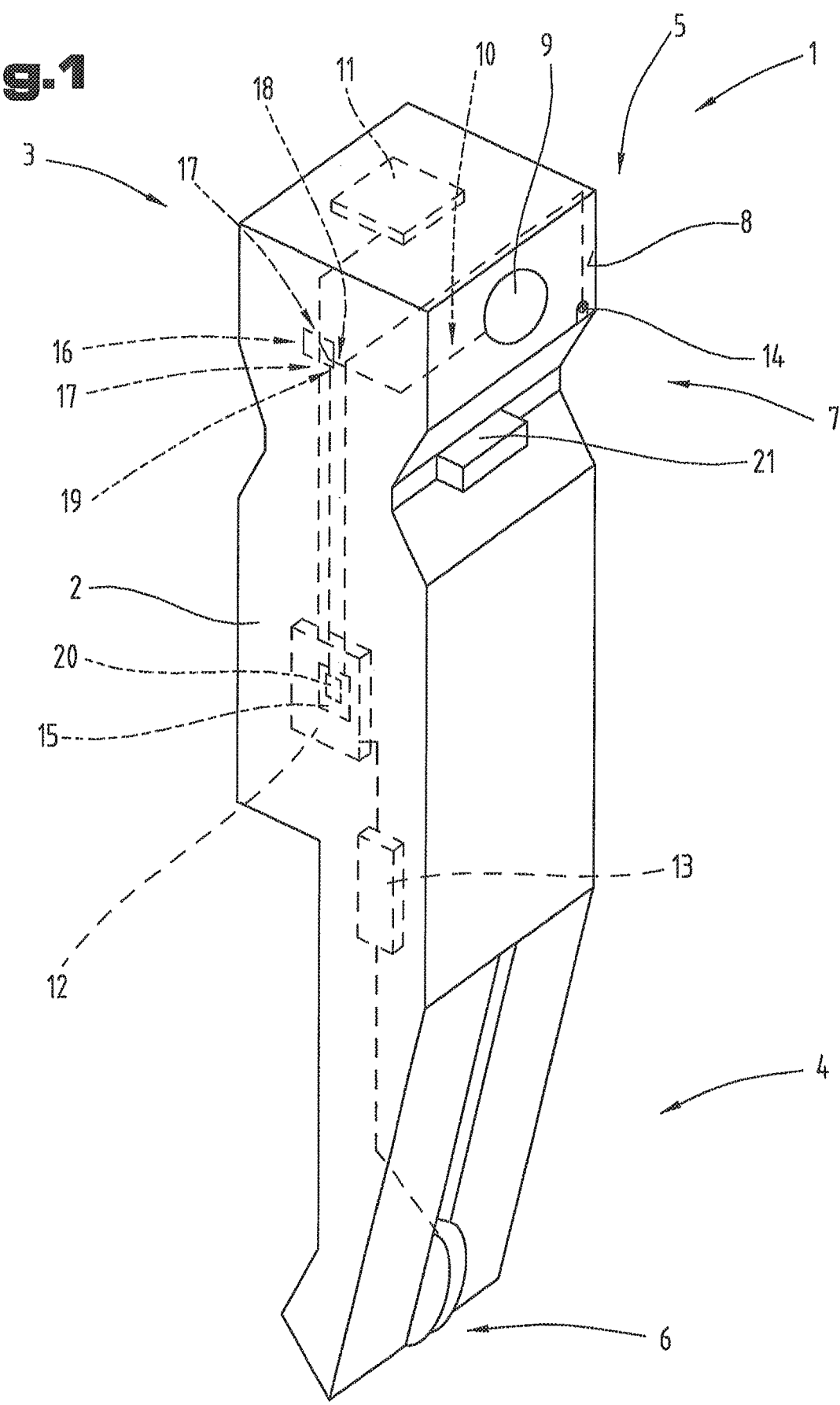

unit (12) is disposed in the tool body (2). A voltage supply contact (14) that is electrically insulated relative to the tool body (2) is is disposed on the attachment extension (5), which contact is connected with a voltage supply module (15) of the electronics unit (12). Furthermore, a change-over switch (16) is disposed in the connection line (10), wherein in a first switching position, the tool identification marker (11) is connected with the communication interface (9), and in a second switching position of the change-over switch (16), the electronics unit (12) is connected with the communication interface (9).

15 Claims, 3 Drawing Sheets

(56) References Cited

U.S. PATENT DOCUMENTS

| | | | |
|---|---|---|---|
| 6,456,054 B1 * | 9/2002 | Kataoka | B23B 27/145 |
| | | | 324/71.2 |
| 7,325,428 B2 * | 2/2008 | Bruggink | B21D 5/02 |
| | | | 72/15.1 |
| 7,513,135 B2 * | 4/2009 | Denkmeier | B21D 5/02 |
| | | | 29/867 |
| 7,791,726 B2 * | 9/2010 | Bruggink | B23Q 17/24 |
| | | | 356/399 |
| 8,255,064 B2 | 8/2012 | Chen et al. | |
| 9,664,493 B2 | 5/2017 | Angerer et al. | |
| 9,766,608 B2 | 9/2017 | Wuertele | |
| 2005/0065647 A1 * | 3/2005 | Perry | B25J 9/161 |
| | | | 700/245 |
| 2008/0184754 A1 * | 8/2008 | Zusi | G05B 19/128 |
| | | | 72/15.1 |
| 2015/0160361 A1 * | 6/2015 | Gondo | B21D 5/02 |
| | | | 324/679 |
| 2017/0333967 A1 | 11/2017 | Angerer et al. | |

FOREIGN PATENT DOCUMENTS

| | | |
|---|---|---|
| CN | 101887250 A | 11/2010 |
| CN | 103056849 A | 4/2013 |
| CN | 104582867 A | 4/2015 |
| EP | 1 520 641 A1 | 4/2005 |
| WO | 2016/094918 A1 | 6/2016 |

* cited by examiner

BENDING TOOL, IN PARTICULAR AN UPPER TOOL OR A BENDING PUNCH, AND A METHOD FOR CHANGING THE OPERATING MODE

CROSS REFERENCE TO RELATED APPLICATIONS

This application is the National Stage of PCT/AT2017/060226 filed on Sep. 12, 2017, which claims priority under 35 U.S.C. § 119 of Austrian Application No. A 50832/2016 filed on Sep. 16, 2016, the disclosure of which is incorporated by reference. The international application under PCT article 21(2) was not published in English.

The invention relates to a bending tool, in particular an upper tool or a bending punch.

For air bending of sheet-metal parts on a bending machine, this machine has a pressure beam having a tool holder, in which tool holder bending tools can be inserted or disposed. A bending machine furthermore generally has a greater longitudinal expanse, so that multiple processing positions can be implemented along this expanse, in that different types of bending tools can be disposed in the tool holder at discrete positions.

During implementation of the bending forming, it is proposed or defined to the operator by the sequence controller at what position the next bending forming is to be carried out. For this reason, it is important that the machine controller or sequence controller can check whether the correct bending tools are inserted at the respective position. In this regard, it is known, for example from AT 506 604 B1, that an identification marker is disposed in the attachment extension of the bending tool, which marker is read, in contact-free manner, by a counter-location disposed in the tool holder in the inserted state. In particular, it is disclosed that the position of a sensor disk is transmitted to a counter-location of the bending machine by way of this identification feature. This sensor disk touches the metal sheet as it bends upward during the bending process, and thereby a determination of the current bending angle already becomes possible during the bending forming. In this regard, this system is designed in such a manner that the electrical energy required for reading is made available by the signal to be read, in particular an electromagnetic alternating signal.

However, it is a disadvantage of this embodiment that due to the given space conditions and the low available electrical energy, the extent of bending can only be captured with a reduced precision.

It is known from the state of the art to supply RFID features or also contact-free chip cards with sufficient electrical energy so as to supply even complex sequences and functionality with electrical energy. Due to the broad distribution of bending tools having a quasi-passive readout of the identification feature, a change in the wireless interface is not possible, since this would lead to incompatibilities with existing bending machines. This is because then, the counter-locations in all tool holders would have to be replaced and/or a risk of damage exists for existing bending tools.

It is therefore the task of the invention to improve a bending tool to the effect that the tool is compatible with existing bending machines and, in particular, allows tool recognition by reading of an identification feature. However, the tool is supposed to be configured to the effect that it offers additional as well as expanded functionality.

This task is accomplished by means of a bending tool, in particular an upper tool or a bending punch. The bending tool comprises a tool body having an upper and an opposite lower end region, wherein an attachment extension is configured in the upper end region, and a working tip is configured in the lower end region. The attachment extension is configured for holding the bending tool in a tool holder, and for this purpose has a clamping section. Furthermore, a tool identification marker is disposed in the tool body. A communication interface is disposed in the attachment extension, in particular outside of the clamping section, on at least one side surface and not projecting beyond it, which interface is connected with the tool identification marker by way of a connection line.

Additionally, an electronics unit is disposed in the tool body. A voltage supply contact that is electrically insulated relative to the tool body is disposed on the attachment extension, which contact is connected with a voltage supply module of the electronics unit. A change-over switch having two inputs and one output is disposed in the connection line, wherein the output is connected with the communication interface, and one of the inputs is connected with the tool identification marker, and the other input is connected with the electronics unit. In a first switching position, in particular in a rest position of the change-over switch, the tool identification marker is connected with the communication interface by way of the change-over switch, and in a second switching position of the change-over switch, the electronics unit is connected with the communication interface by way of the change-over switch. The first switching position establishes a passive operational mode of the bending tool, and the second switching position establishes an active operational mode of the bending tool.

The present bending tool will preferably be used in a bending press, where it is held in the or by the tool holder. The designations upper and lower end region should therefore be understood with reference to the vertically oriented installation position. For this reason, the working tip should be understood to be the lowermost part of the bending tool, which contacts a workpiece to be formed and forms the workpiece by means of introduction of the bending force.

With this embodiment, it is guaranteed, in advantageous manner, that an automatic selection of the operational mode of the bending tool is achieved. In particular, it is possible to be able to use the present advanced bending tool even in tool holders that do not support an active operational mode. Depending on the configuration of the tool holder, purely active, purely passive or optionally mixed use is therefore possible.

According to a further development, it is provided that the change-over switch is configured as an electronic switch, in particular as a semiconductor switch. Electronic switches have the advantage that very fast switching and, above all in the case of low voltages, also reliable contacting is guaranteed. In a preferred embodiment, the supply voltage amounts to 16 V, which is lowered to 5 V by way of circuitry. Specifically in the case of low switching voltages and low currents to be switched, mechanical switches have the disadvantage that thin insulating layers can form on the switching contacts, which layers hinder reliable contacting. Here, semiconductor switches have the particular advantage that a non-mechanical semiconductor channel, for example of an FET, is switched to be conductive.

With regard to reliable and uninterrupted signal transmission from the electronics unit to the communication interface, it is advantageous if the change-over switch is configured to be low in capacitance. The signals to be transmitted between the electronics unit and the communication interface are generally low-amplitude digital signals, in the case of which the most distortion-free or low-distortion transmission of the signal is required, so as to be able to transmit the signal by way of the communication interface and to subsequently evaluate it. Capacitances in the signal path, in particular in the change-over switch, impair reliable signal transmission and can actually cause loss of communication. Aside from the connection line, the change-over switch has a significant share of the total capacitance-related influence on the signal path, so that a low-capacitance change-over switch is advantageous. For example, PAM is used as the transmission or modulation method, wherein further transmission methods are known to a person skilled in the art.

Furthermore, a further development according to which a control connector of the change-over switch is connected with a monitoring module of the voltage supply module is advantageous, which monitoring module is configured for the purpose of controlling the change-over switch for changing between the two switching positions. Only when the bending tool is disposed in a tool holder that can make an electrical voltage available at the voltage supply contact, the passive operational mode is automatically terminated and a switch to the active operational mode takes place. Alternatively, when the voltage supply process is terminated, for example when the bending tool is removed from the tool holder, an automatic switch back to the passive operational mode takes place.

Since some bending tools are configured symmetrically with reference to their vertical expanse, it is provided, according to a further development, that the communication interface is disposed on two opposite side surfaces of the attachment extension. In this way, attention does not need to be paid to correct orientation during insertion of the bending tool into the tool holder.

It can also be provided that it is only supposed to be possible to activate the active operational mode of the present bending tool in special tool holders. For this reason, it can be provided that an activation element is present in the clamping section, which element is movement-connected with the voltage supply contact, and is configured so as to move this voltage supply contact between a position in which it does not project beyond the side surface and a position in which it projects beyond the side surface. With the present embodiment, it is ensured, by means of mechanical/design properties of the bending tool, that the voltage supply contact is only moved out when the tool is situated in a tool holder. Therefore the voltage supply contact is reliably protected against damage during manipulation actions of the tool, for example when being placed in a tool storage unit or being inserted into or removed from the tool holder.

A further development also consists in that the electronics unit is disposed in a recess of the tool body. Thereby the electronics components are protected during proper use of the bending tool. In addition, it is guaranteed that no additional space requirement is necessary for the evaluation electronics, which would lead to a restriction of the available working space.

According to a further development, it is furthermore provided that the electronics unit is connected with a bending characteristic data sensor, and which bending characteristic data sensor is preferably disposed in the lower end region. With this embodiment, the result is achieved that the bending angle that occurs can be determined in the direct vicinity of the bending line, if at all possible. The metal sheet to be formed is contacted by the bending tool along the bending line, and formed due to the introduction of force. By means of capture of the bending angle that occurs, which capture takes place as close as possible to the bending line, corrective intervention is possible very well and, above all, very early, so as to be able to form the required bending angle.

A further development consists in that the bending characteristic data sensor is configured as a tactile disk sensor. Thereby capture of the bending angle that occurs is possible while bending is being carried out and, above all, as close as possible to the bending line.

According to a further development, it is provided that a bridging switch is disposed in the tool identification marker, which switch is closed, in particular, in the active operational state. The tool identification marker is designed for passive operation, and will thereby generally work at very low signal levels, i.e. the electrical parameters of the line characteristics (for example capacitance, wave resistance, etc.) will differ from those of active operation. With this further development, it can now be guaranteed that no reciprocal interference of the tool identification marker and of the electronics unit will come about in active operation. This bridging switch can be configured as a short-circuit switch, for example, so as to short-circuit the signal line between the tool identification marker and the change-over switch, which will be structured with two poles. As a result, no feedback of the tool identification marker on the change-over switch will occur, either.

A further development also consists in that the communication interface is configured in wireless manner and for transmission of electrical energy and communication data. In this way, the result is achieved, in advantageous manner, that by means of placement of the bending tool in the tool holder, data-technology communication and supply with electrical energy are guaranteed, without an independent connection having to be produced for this purpose.

In order to guarantee the least possible influence on the work sequence, it is advantageous if, according to a further development, the communication interface is configured in wireless manner. Therefore no difference between a standard bending tool and the present, further developed bending tool exists for the machine operator when setting up the machine.

In the surroundings of machine tools, interference with wireless communication can occur due to the plurality of motors, which are generally driven by way of frequency inverters, or also due to the solid metal parts. For this reason, it can be provided, according to a further development, that the communication interface is configured as a contact-based multiple contact.

The task of the invention is also accomplished by means of a method for operational change-over of a present bending tool. The bending tool is inserted into a tool holder with the attachment extension, in such a manner that the communication interface is disposed on the attachment extension so as to lie opposite a communication counter-location of the tool holder. Furthermore, the tool identification marker is thereby connected with the communication interface, and this corresponds to the passive operational state of the bending tool. The voltage supply contact is monitored by the monitoring module of the voltage supply module, and if an electrical voltage is recognized at the voltage supply contact, a change-over signal is generated, which is also applied to the change-over switch due to the connection of the monitoring module with this switch. Then the connection between the tool identification marker and the communication interface is separated by the change-over switch, and a connection between the electronics unit and the communication interface is produced. This is done by using the change-over signal and thereby changing the change-over switch to the second switching position, which corresponds to the active operational state of the bending tool. This connection between the electronics unit and the communication interface is maintained until the absence of an electrical voltage at the voltage supply contact is recognized. Then termination of the active operational state and production of the passive operational state, by means of the change-over switch, take place.

Herein, use of the signal is understood to mean that the change-over process is carried out at the change-over switch. In the case of an electromechanical change-over switch, the exciter coil is supplied with energy, for example, and thereby the change-over contact is moved. In the case of an electronic switch, generally a voltage is applied to the switch, and thereby a channel that is self-locking without excitation, for example, becomes conductive.

According to a further development, it is also provided that before production of the active operational state, the bridging switch is closed by means of use of the change-over signal. This further development has the advantage that in this way, reliable separation of the components of the passive and the active operational state is achieved.

For a better understanding of the invention, it will be explained in greater detail below, using the following figures.

Figure 2:
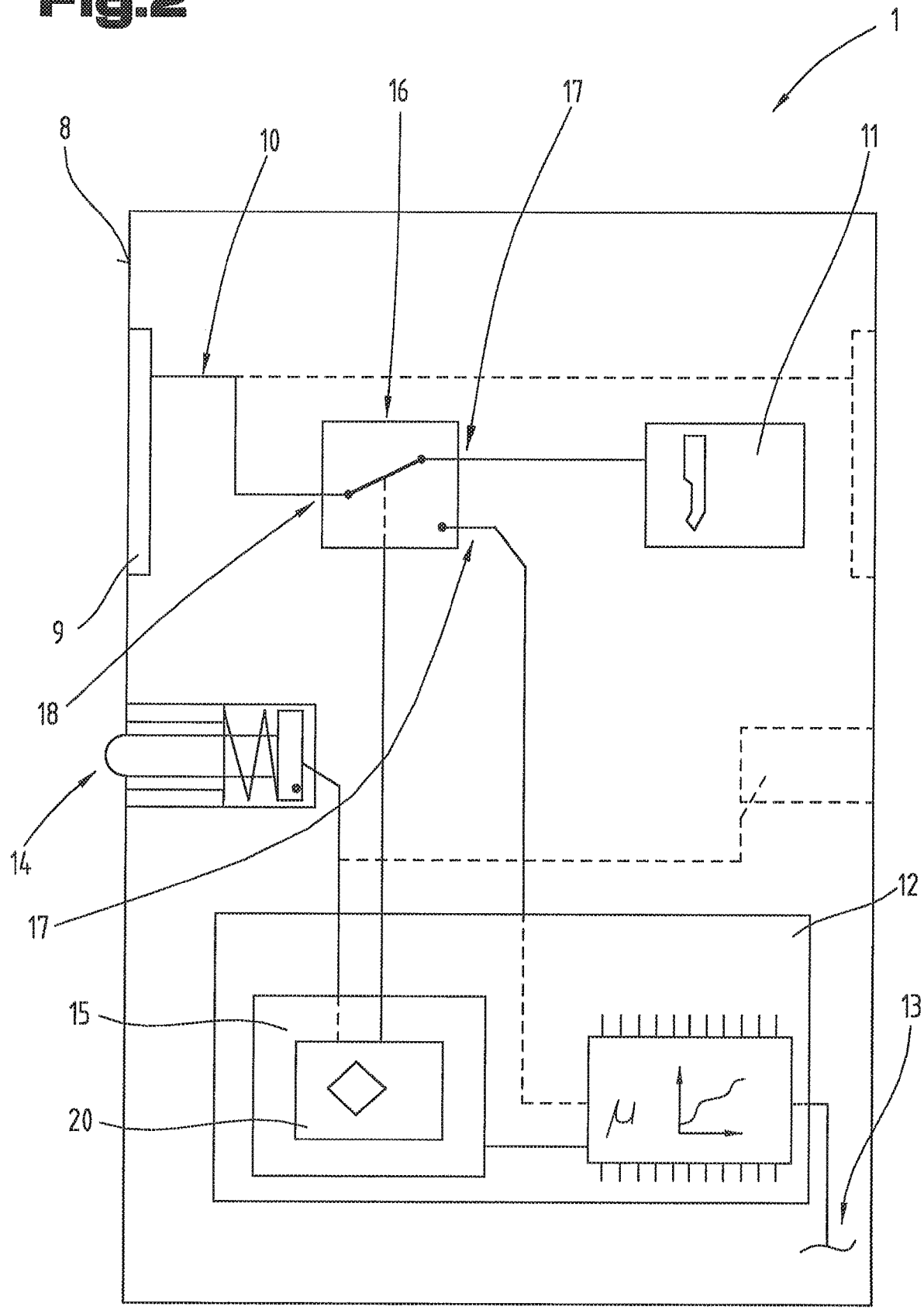
Figure 3:
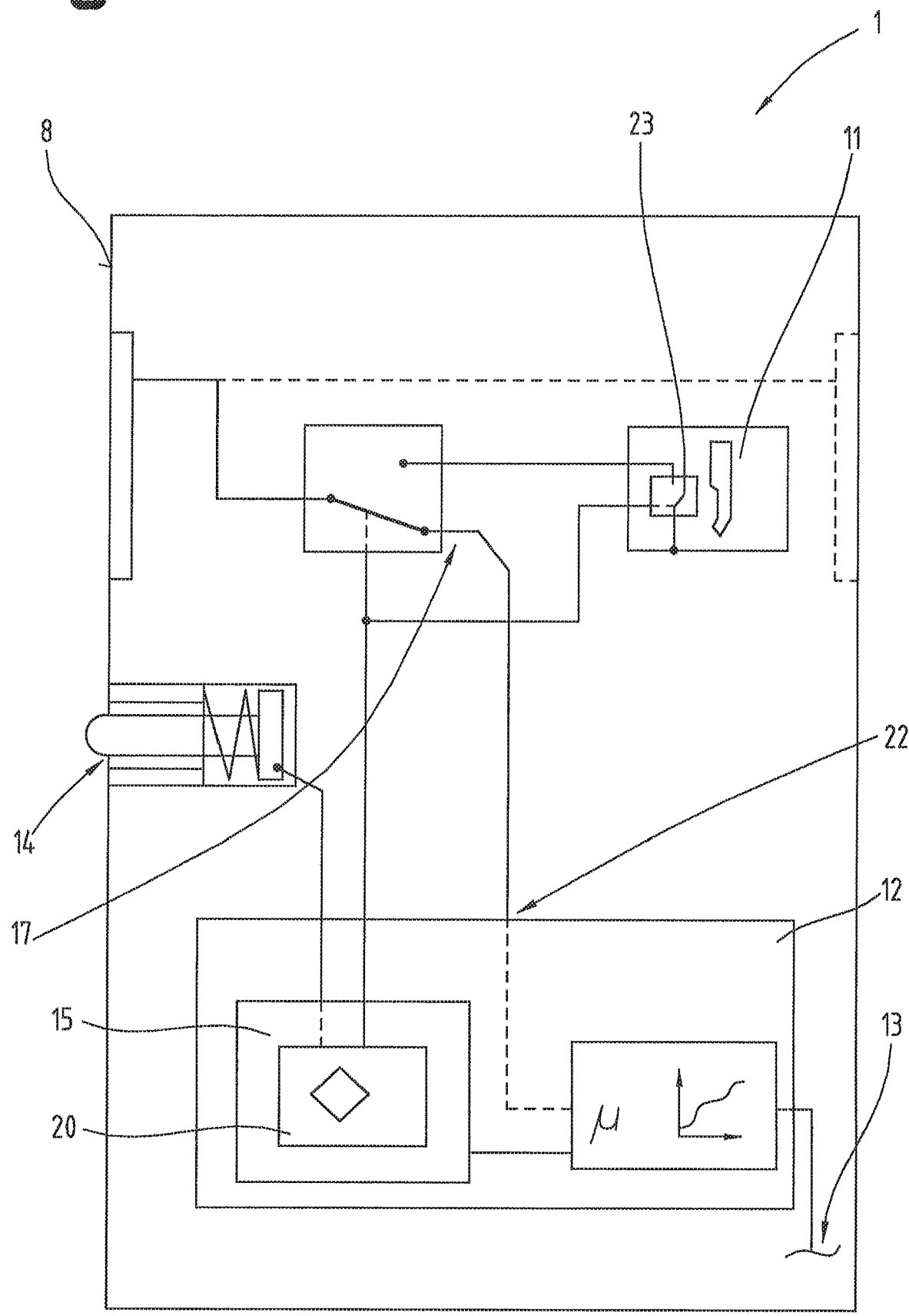

The figures show, each in a greatly simplified, schematic representation:

FIG. 1 a fundamental representation of the present bending tool;

FIG. 2 an electrical equivalent circuit diagram of the passive operation of the bending tool;

FIG. 3 an electrical equivalent circuit diagram of the active operation of the bending tool, with a further option of a bridging switch.

FIG. 1 shows the present bending tool 1, in particular an upper tool or a bending punch, which bending tool 1 has a tool body 2 having an upper end region 3 and an opposite lower end region 4. An attachment extension 5 is configured in the upper end region 3; a working tip 6 is configured in the lower end region 4. The attachment extension 5 is configured to hold the bending tool 1 in a tool holder, not shown, and has a clamping section 7 for this purpose.

A communication interface 9 is disposed on the attachment extension 5, but in particular outside of the clamping section 7, on at least one side surface 8 and not projecting beyond it. This communication interface 9 is connected with a tool identification marker 11 by way of a connection line 10, which tool identification marker 11 is disposed in the tool body 2, in particular in a recess in the upper end region 3. An electronics unit 12 is disposed in the tool body 2, in particular also in a recess of the same, which unit is connected with a bending characteristic data sensor 13. Features of this bending characteristic data sensor 13 are not explained in any greater detail, since they are not of any importance for the present embodiment of the bending tool.

Furthermore, a voltage supply contact 14 that is electrically insulated with regard to the tool body 2 is disposed on the attachment extension 5, on at least one side surface 8, which voltage supply contact 14 is connected with a voltage supply module 15 of the electronics unit 12.

A change-over switch 16 is disposed in the connection line 10 between the communication interface 9 and the tool identification marker 11, which change-over switch has two inputs 17 and one output 18. The output 18 is connected with the communication interface 9; one of the inputs 17 is connected with the tool identification marker 11, the other input 17 is connected with the electronics unit 12. In a first switching position, which corresponds to a rest position of the change-over switch 16, the tool identification marker 11 is connected with the communication interface 9 by way of the change-over switch 16. In this switching position, a passive operational mode of the bending tool 1 is established. In a second switching position of the change-over switch 16, the electronics unit 12 is connected with the communication interface 9 by way of the change-over switch 16, and thereby an active operational mode of the bending tool is established.

To change the switching positions of the change-over switch 16, this switch is connected with a monitoring module 20 of the voltage supply module 15 by way of a control connector 19.

When the bending tool 1 is placed in a tool holder, the activation element 21, which is disposed in the clamping section 7 and movement-connected with the voltage supply contact 14, is pressed in by the tool holder, so that the voltage supply contact 14 is moved out and projects beyond the side surface 8 of the attachment extension 5. In the case of a usual tool holder, the voltage supply contact 14 will therefore generally contact the tool holder. Since this holder does not have a voltage supply rail, the bending tool 1 will remain in the passive operational state. In the case of placement of the bending tool 1 in an advanced tool holder, the voltage supply contact 14 will contact a voltage supply rail of the tool holder. If electrical voltage is applied to this voltage supply rail, the change-over switch 16 is activated, and the bending tool 1 is in the active operational mode. If no electrical voltage is applied, the bending tool remains in the passive operational mode even in an advanced tool holder. Therefore it is possible to optionally change between the active and passive operational mode of the bending tool 1 by way of applying an electrical voltage to the voltage supply rail.

According to another possible embodiment, it can be provided that the communication interface 9 and the voltage supply contact 14 are also disposed on the opposite side surface, so that when the bending tool 1 is placed in the tool holder, it is not necessary to pay attention to an orientation of the bending tool 1. Preferably, the activation element 21 is then also disposed in the opposite clamping section 7, so that moving the voltage supply contact 14 out is guaranteed in every placement orientation of the bending tool.

FIG. 2 shows a fundamental representation of the electrical and/or electronic components for switching the present bending tool 1 between the passive and active operational state. In the figure, the passive operational state is shown, in which the present bending tool 1 is disposed in a non-advanced tool holder of a widespread bending machine. A communication interface 9 is disposed on a side surface 8, not projecting beyond it, wherein this communication interface 9 is preferably configured for wireless communication with a corresponding counter-location of the tool holder. Likewise, a voltage supply contact 14 is disposed in the side surface 8, which contact is moved out as the result of clamping of the tool and pressing in of the activation related to that, and thereby projects beyond the side surface 8. For reasons of simplification, and since it is not of any importance for the present bending tool, the clamping section, the attachment element, and the mechanism for changing the position of the voltage supply contact 14 were not shown in the figure. According to advantageous further developments, a communication interface and a voltage supply contact can also be disposed on the opposite side surface. In the figure, this is indicated by means of a broken-line representation of the components and of the connection lines. Furthermore, there is mention of one communication interface and one voltage-supply unit, wherein, however, a double-sided embodiment is also covered.

The voltage supply contact 14 is held resiliently, so that the bending tool 1 can also be disposed in a tool holder in which no room or insufficient room for such a contact is provided. The contact is then not moved out or only moved out partially; in any case, no damage of the voltage supply contact 14 comes about as the result of this embodiment.

In the passive operational state of the bending tool 1, the change-over switch 16 is in its first switching position or in the rest position. In this regard, an input 17 of the two inputs is connected with the tool identification marker 11; the output 18 of the change-over switch 16 is connected with the communication interface 9 by way of the connection line 10. Due to the lack of voltage supply, the electronics unit 12 is deactivated, so that no signal is applied at the second input 17 of the change-over switch 16. Due to the lack of supply voltage, of course, no change-over signal is generated by the monitoring module 20 of the voltage supply module 15, either.

FIG. 3 shows the situation in the active operational state, in which the present bending tool 1 is disposed in an advanced tool holder. Because of the tool clamping, the activation element is pressed into the clamping section, and thereby the voltage supply contact 14 projects beyond the side surface 8.

In the placed state, the voltage supply contact 14 contacts a contact surface in the tool holder that lies opposite the contact, so that the electronics unit 12 is supplied with electrical energy by way of the connection line between it and the voltage supply module 15. The presence of an electrical voltage at the voltage supply contact 14 is monitored by the monitoring module 20 of the voltage supply module 15. As soon as an applied electrical voltage is recognized, a change-over signal is generated by the monitoring module 20, which signal is applied to or transmitted to the change-over switch 16 by way of the connection line between it and the monitoring module 20. The change-over switch 16 is controlled to go into its second switching position when this change-over signal is applied, and then connects the electronics unit 12, in particular a data output 22 of the electronics unit 12, with the communication interface 9, by way of the second input 17 of the change-over switch 16. Afterward, the bending characteristic data sensor 13 is evaluated by the electronics unit 12, the captured characteristic data are processed and transmitted to the machine controller or a sequence controller by way of the communication interface 9.

If it is recognized by the monitoring module 20 that no electrical voltage is present any longer at the voltage supply contact 14, the active operational state is terminated and a return to the passive operational state takes place, for example in that a further change-over signal is generated or the existing change-over signal is removed from the change-over switch 16 or turned off. This switch will then return to its first switching position or rest position and once again connect the tool identification marker 11 with the communication interface 9.

Since the change-over switch 16 is preferably configured as an electronic switch, for example as an FET switch, and thereby separation of the two inputs 17 takes place only by way of semiconductor barrier layers or blocked channels, capacitive couplings can form, which can impair reliable separation of the two inputs relative to one another. In particular, interference of the communication between the electronics unit 12 and the counter-location can come about by means of the tool identification marker 11 in the active operational state, if applicable. For this reason, it can optionally be provided, according to a further embodiment, that a bridging switch 23 is disposed in the tool identification marker 11, to which switch the change-over signal is also applied, so that it is closed in the active operational state. As a result, feedback of the tool identification switch to the change-over switch and, by way of a capacitive influence, also to the communication between the electronics unit and the counter-location, can be prevented.

The particular advantage of the present bending tool consists in that this tool can be used in tool holders of bending machines that are currently in use and are widespread, and allows passive identification of the bending tool there. In addition, it is possible, in the active operational state, to evaluate measurement data of a bending characteristic data sensor and to transmit them to a counter-location by way of the same communication interface. In this regard, this change-over takes place automatically, without the machine operator having to take action in this regard.

In conclusion, it should be stated that in the different embodiments described, the same parts are provided with the same reference symbols or the same component designations, wherein the disclosures contained in the description as a whole can be applied analogously to the same parts having the same reference symbols or the same component designations. Also, the position information selected in the description, such as at the top, at the bottom, on the side, etc., relates to the figure being directly described and shown, and this position information must be applied analogously to a new position in the case of a change in position.

The exemplary embodiments show possible embodiment variants, wherein it should be noted at this point that the invention is not restricted to the embodiment variants of the same that are specifically shown, but rather, instead, various combinations of the individual embodiment variants with one another are possible, and this variation possibility lies within the ability of a person skilled in the art and working in this technical field, on the basis of the teaching of the present invention concerning technical action.

The scope of protection is determined by the claims. However, the description and the drawings should be referred to for interpreting the claims. Individual characteristics or combinations of characteristics from the different exemplary embodiments shown and described can represent independent inventive solutions by themselves. The task on which the independent inventive solutions are based can be derived from the description.

All information regarding value ranges in the present description should be understood to mean that these include any and all partial ranges of them; for example, the information 1 to 10 should be understood to mean that all partial ranges, proceeding from the lower limit 1 and also including the upper limit 10 are also included; i.e. all partial ranges start with a lower limit of 1 or more and end at an upper limit of 10 or less, for example 1 to 1.7, or 3.2 to 8.1, or 5.5 to 10.

For the sake of good order, it should be pointed out, in conclusion, that for a better understanding of the structure, elements were shown not to scale and/or increased in size and/or reduced in size, in part.

REFERENCE SYMBOL LISTING 1 bending tool
2 tool body
3 upper end region
4 lower end region 5 attachment extension
6 working tip
7 clamping section
8 side surface
9 communication interface
10 connection line
11 tool identification marker
12 electronics unit
13 bending characteristic data sensor
14 voltage supply contact
15 voltage supply module
16 change-over switch
17 input
18 output
19 control connector
20 monitoring module
21 activation element
22 data output
23 bridging switch

The invention claimed is:

1. A bending tool comprising a tool body having an upper and an opposite lower end region, wherein an attachment extension is configured in the upper end region, and a working tip is configured in the lower end region,
   wherein the attachment extension is configured for holding the bending tool in a tool holder, and has a clamping section, and
   wherein a tool identification marker is disposed in the tool body, and
   wherein a communication interface is disposed in the attachment extension on at least one side surface and not projecting beyond it, which interface is connected with the tool identification marker by way of a connection line,
   wherein
      sensor evaluation electronics are disposed in the tool body,
      wherein a voltage supply contact that is electrically insulated relative to the tool body is disposed on the attachment extension, which contact is connected with a voltage supply module of the electronics unit,
      wherein a change-over switch having two inputs and one output is disposed in the connection line, wherein the output is connected with the communication interface, and one of the inputs is connected with the tool identification marker, and the other input is connected with the with the electronics unit,
      wherein in a first switching position of the change-over switch, the tool identification marker is connected with the communication interface by way of the change-over switch,
      wherein in a second switching position of the change-over switch, the electronics unit is connected with the communication interface by way of the change-over switch, and
      wherein the first switching position establishes a passive operational mode of the bending tool, and the second switching position establishes an active operational mode of the bending tool.

2. The bending tool according to claim 1, wherein the change-over switch is configured as an electronic switch.

3. The bending tool according to claim 1, wherein the change-over switch is configured to be low in capacitance.

4. The bending tool according to claim 1, wherein a control connector of the change-over switch is connected with a monitoring module of the voltage supply module, which monitoring module is configured for controlling the change-over switch for changing between the two switching positions.

5. The bending tool according to claim 1, wherein the communication interface is disposed on two opposite side surfaces of the attachment extension.

6. The bending tool according to claim 1, wherein an activation element is disposed in the clamping section, which activation element is movement-connected with the voltage supply contact, and is configured so as to move this voltage supply contact between a position in which it does not project beyond the side surface and a position in which it projects beyond the side surface.

7. The bending tool according to claim 1, wherein the electronics unit is disposed in a recess of the tool body.

8. The bending tool according to claim 1, wherein the electronics unit is connected with a bending characteristic data sensor, and which bending characteristic data sensor is disposed in the lower end region.

9. The bending tool according to claim 8, wherein the bending characteristic data sensor is configured as a tactile disk sensor.

10. The bending tool according to claim 1, wherein a bridging switch is disposed in the tool identification marker, which switch is closed in the active operational state.

11. The bending tool according to claim 1, wherein the communication interface comprises a wireless communication interface for transmission of electrical energy and communication data.

12. The bending tool according to claim 1, wherein the communication interface comprises a wireless communication interface.

13. The bending tool according to claim 1, wherein the communication interface comprises a contact-based multiple contact communication interface.

14. A method for operational change-over of a bending tool, which bending tool is configured according to claim 1, the method comprising the following steps:
   inserting the bending tool into a tool holder with the attachment extension, such that the communication interface is disposed on the attachment extension so as to lie opposite a communication counter-location of the tool holder,
   connecting the tool identification marker with the communication interface to correspond to the passive operational state of the bending tool,
   monitoring the voltage supply contact with a monitoring module of the voltage supply module;
   recognizing an electrical voltage at the voltage supply contact and generating a change-over signal, which is also applied to the change-over switch due to the connection of the monitoring module with the change-over switch;
   separating a connection between the tool identification marker and the communication interface with the change-over switch;
   producing a connection between the electronics unit and the communication interface by using the change-over signal and thereby changing the change-over switch to the second switching position and thereby producing the active operational state of the bending tool;
   maintaining a connection between the electronics unit and the communication interface until an absence of an electrical voltage at the voltage supply contact is recognized, and then terminating the active operational state and producing the passive operational state with the change-over switch.

15. The operational change-over method according to claim 14, wherein the bridging switch is closed before production of the active operational state by the change-over sign.

* * * * *